US009524957B2

(12) United States Patent
Hebert et al.

(10) Patent No.: US 9,524,957 B2
(45) Date of Patent: Dec. 20, 2016

(54) BACK-TO-BACK STACKED DIES (75) Inventors: Francois Hebert, San Mateo, CA (US);
Steven R. Rivet, Malabar, FL (US);
Michael Althar, Melbourne, FL (US);
Peter Oaklander, Saratoga, CA (US)

(73) Assignee: Intersil Americas LLC, Milpitas, CA (US)

( * ) Notice: Subject to any disclaimer, the term of this patent is extended or adjusted under 35 U.S.C. 154(b) by 248 days.

(21) Appl. No.: 13/358,718

(22) Filed: Jan. 26, 2012

(65) Prior Publication Data
US 2013/0043940 A1    Feb. 21, 2013

Related U.S. Application Data (60) Provisional application No. 61/524,382, filed on Aug. 17, 2011.

(51) Int. Cl.
*H01R 43/00* (2006.01)
*H01L 25/16* (2006.01)
(Continued)

(52) U.S. Cl.
CPC ........... *H01L 25/16* (2013.01); *H01L 23/3732* (2013.01); *H01L 23/4334* (2013.01); *H01L 23/49575* (2013.01); *H01L 24/49* (2013.01); *H01L 23/3107* (2013.01); *H01L 23/49562* (2013.01); *H01L 23/645* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/05553* (2013.01); *H01L 2224/16245* (2013.01);
(Continued)

(58) Field of Classification Search
CPC .. H01L 23/3732; H01L 23/4334; H01L 24/49; H01L 2924/2919; Y10T 29/49121; Y10T 29/49117; Y10T 29/49002
USPC ....... 29/827, 825, 592.1; 257/778, 737, 666, 257/E23.068, E23.031, E25.029, E21.499, 257/777, 734; 327/564; 438/108; 361/760
See application file for complete search history.

(56) References Cited

U.S. PATENT DOCUMENTS 6,906,416 B2 * 6/2005 Karnezos .............. H01L 21/563
257/723
7,166,495 B2 * 1/2007 Ball ........................ H01L 25/50
257/E21.705
(Continued)

FOREIGN PATENT DOCUMENTS

CN  1499620    5/2004
CN  101290930  10/2008
(Continued)

OTHER PUBLICATIONS

"Synchronous Buck NexFET Power Block", Dec. 2010, pp. 1-17, Publisher: Texas Instruments Incorporated.
(Continued)

*Primary Examiner* — Peter DungBa Vo
*Assistant Examiner* — Azm Parvez
(74) *Attorney, Agent, or Firm* — Fogg & Powers LLC (57) ABSTRACT Embodiments disclosed herein provide for a circuit including first die having an active side and a backside, wherein the first die is flip-chip mounted to a carrier. The circuit also includes a second die stacked on the backside of the first die, wherein the second die is stacked on the first die such that a backside of the second die is facing the backside of the first die and an active side of the second die faces away from the first die.

11 Claims, 12 Drawing Sheets (51) Int. Cl.
*H01L 23/373* (2006.01)
*H01L 23/433* (2006.01)
*H01L 23/495* (2006.01)
*H01L 23/00* (2006.01)
*H01L 23/31* (2006.01)
*H01L 23/64* (2006.01)

(52) U.S. Cl.
CPC  *H01L 2224/291* (2013.01); *H01L 2224/2919* (2013.01); *H01L 2224/32013* (2013.01); *H01L 2224/32145* (2013.01); *H01L 2224/45014* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/48472* (2013.01); *H01L 2224/49111* (2013.01); *H01L 2224/49171* (2013.01); *H01L 2224/73253* (2013.01); *H01L 2224/73265* (2013.01); *H01L 2224/83801* (2013.01); *H01L 2224/83855* (2013.01); *H01L 2224/92247* (2013.01); *H01L 2225/06558* (2013.01); *H01L 2924/01015* (2013.01); *H01L 2924/01029* (2013.01); *H01L 2924/12032* (2013.01); *H01L 2924/1306* (2013.01); *H01L 2924/13064* (2013.01); *H01L 2924/13091* (2013.01); *H01L 2924/181* (2013.01); *Y10T 29/49121* (2015.01)

(56) References Cited

U.S. PATENT DOCUMENTS

| | | | |
|---|---|---|---|
| 7,271,470 B1 | 9/2007 | Otremba | |
| 7,309,923 B2* | 12/2007 | Kee | H01L 23/49575 257/666 |
| 7,436,048 B2* | 10/2008 | Ha | H01L 23/3107 257/666 |
| 7,485,954 B2 | 2/2009 | Havanur | |
| 7,569,920 B2 | 8/2009 | Otremba et al. | |
| 7,598,603 B2* | 10/2009 | Otremba | H01L 23/4334 257/666 |
| 7,745,920 B2* | 6/2010 | Lee | H01L 21/76898 257/685 |
| 7,898,092 B2 | 3/2011 | Lu et al. | |
| 7,923,300 B2 | 4/2011 | Bell et al. | |
| 8,358,013 B1* | 1/2013 | Liou | H01L 23/3107 257/777 |
| 2001/0052641 A1 | 12/2001 | Kuo et al. | |
| 2005/0087854 A1* | 4/2005 | Choi | H01L 23/49816 257/686 |
| 2007/0109756 A1* | 5/2007 | Park | H01L 25/0657 361/760 |
| 2007/0138628 A1 | 6/2007 | Lam | |
| 2007/0215996 A1 | 9/2007 | Otremba | |
| 2009/0160595 A1 | 6/2009 | Feng et al. | |
| 2009/0189266 A1 | 7/2009 | Liu et al. | |
| 2009/0302438 A1 | 12/2009 | Chauhan et al. | |
| 2010/0123227 A1 | 5/2010 | Dahilig et al. | |
| 2010/0171543 A1 | 7/2010 | Korec et al. | |
| 2010/0176508 A1 | 7/2010 | Herbsommer et al. | |
| 2011/0148506 A1 | 6/2011 | Korec et al. | |
| 2011/0221421 A1* | 9/2011 | Williams | G01R 19/0092 324/76.11 |

FOREIGN PATENT DOCUMENTS

TW    200729361    8/2007
TW    200839510    10/2008

OTHER PUBLICATIONS

"Synchronous Buck NexFET Power Block", Nov. 2010, pp. 1-17, Publisher: Texas Instruments Incorporated.
"Synchronous Buck NexFET Power Stage", May 2011, pp. 1-22, Publisher: Texas Instruments Incorporated.
Korec et al., "History of FET Technology and the Move to NexFET", "Bodo's Power Systems", May 2009, pp. 44-46, Publisher: Texas Instruments Incorporated.
Korec et al., "Next Generation of Power MOSFETs", "Power Electronics Europe", 2009, pp. 26-28, No. 4, Publisher: Texas Instruments Incorporated.
"NexFET Power MOSFETs Quick Reference Guide", "www.ti.com/nexfet", 2010, pp. 1-5, Publisher: Texas Instruments Incorporated.
Romig et al., "3D Packaging Advancements Drive Performance, Power and Density in Power Devices", Jul. 2011, pp. 1-9, Publisher: Texas Instruments Incorporated.
Sherman et al., "Advancing Silicon Performance Beyond the Capabilities of Discrete Power MOSFETs", "Bodo's Power Systems", Jul. 2010, pp. 22-25, Publisher: Texas Instruments Incorporated.
"4.5-V to 14-V Input High-Current Synchronous Buck Converter", Mar. 2011, pp. 1-25, Publisher: Tesas Instruments Incorporated.
Taiwan International Patent Office, "Office Action from TW Application No. 101115441 mailed Oct. 19, 2015", "from Foreign Counterpart of U.S. Appl. No. 13/358,718", filed Oct. 19, 2015, pp. 1-24, Published in: TW.
The State Intellectual Property Office of the People'S Republic of China, "First Office Action from CN Application No. 201210202024.6 mailed Feb. 29, 2016", "from Foreign Counterpart of U.S. Appl. No. 13/358,718", filed Feb. 29, 2016, pp. 1-30, Published in: CN.
Taiwan Intellectual Property Office, "Office Action from TW Application No. 101115441", "from Foreign counterpart of U.S. Appl. No. 13/358,718", filed Feb. 15, 2016, pp. 1-26, Published in: TW.
The State Intellectual Property Office of the People's Republic of China, Office Action from CN Application No. 201210202024.6 mailed Oct. 17, 2016, from foreign counterpart of U.S. Appl. No. 13/358,718, Oct. 17, 2016, pp. 1-6, Published in: CN.

* cited by examiner

BACK-TO-BACK STACKED DIES

CROSS-REFERENCE TO RELATED APPLICATIONS

This application claims the benefit of priority to U.S. Provisional Application No. 61/524,382, filed on Aug. 17, 2011, which is hereby incorporated herein by reference.

DETAILED DESCRIPTION

Figure 1:
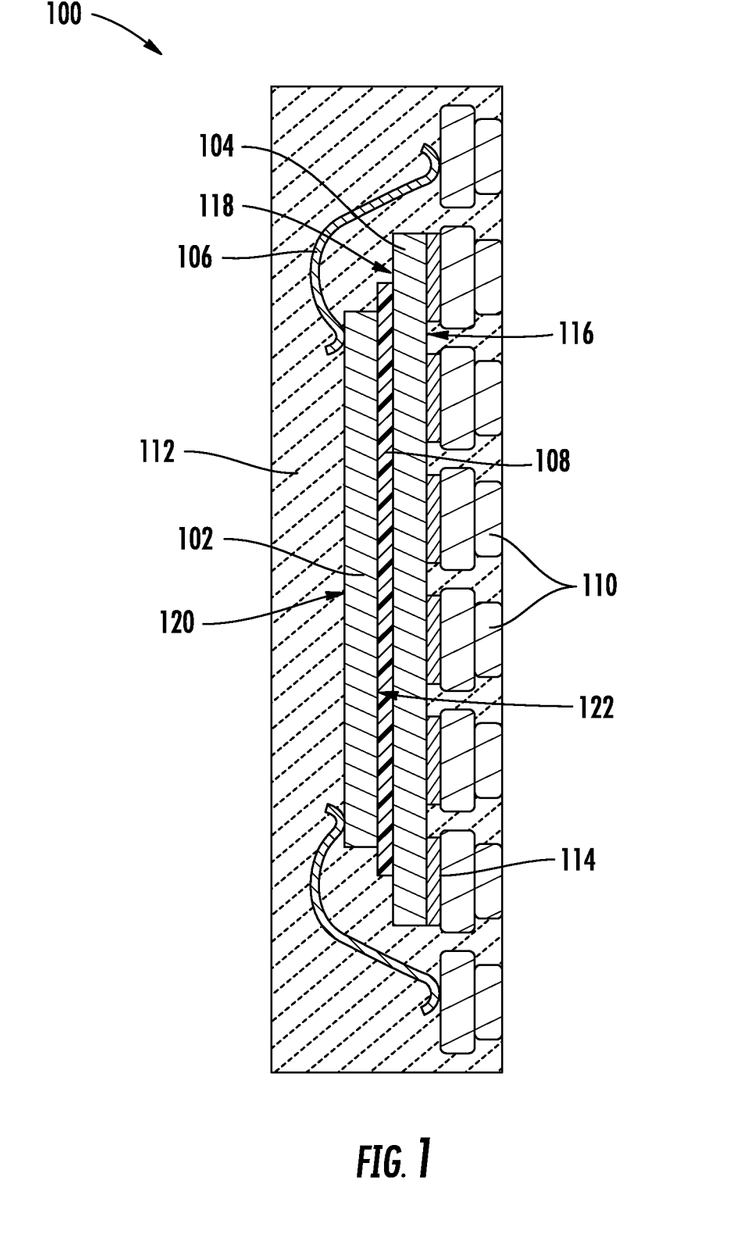
FIG. 1 is a cross-sectional view of an embodiment of an integrated circuit (IC) power conversion system having a controller IC stacked on an inverted power stage.

FIG. 1 is a cross-sectional view of an embodiment of a power conversion system 100 having a controller IC 102 stacked on a power stage IC 104. The power stage IC 104 can comprise a die (i.e., a monolithic IC) including a high side device and/or a low side device having a lateral structure. As used herein a lateral structure refers to a structure where the signal connections (e.g., source, drain, gate) for the high side and low side device are on a first side (also referred to herein as the "active side" and "working surface") of the substrate and the opposite side (also referred to herein as the "backside") of the substrate can be used for connection to the substrate (e.g., a DC ground). A die having a lateral structure can include one or more elements (e.g., transistors, diodes, etc.) having a lateral structure.

In an example, the high side and low side devices include one or more high side and low side transistors (e.g., field effect transistors (FETs)) respectively, in order to, for example, implement a step-down (e.g., a synchronous buck) converter. In other examples, the low side device can include a diode (e.g., a Shottky diode in a non-synchronous buck converter). In still other examples, the power stage can include a NMOSFET as a low side device with a Schottky diode coupled in series with an output load.

The power stage IC 104 can be composed of any suitable material with a suitable doping. For example, the power stage IC 104 can have a substrate formed of silicon, germanium, group III-V or III-N compounds (e.g., gallium nitride, gallium arsenide), silicon on insulator (SOT) (e.g., silicon on diamond, silicon on diamond on silicon), and others. The substrate can also be doped appropriately to form, for example, a P- or Pepi on P+ substrate. In SOI examples, the power stage IC 104 can be an N or P type backside wafer. The power stage IC 104 can also have a metal layer on the backside as shown and described with respect to FIGS. 5 and 6 below. The high side and low side devices can comprise any suitable structure including N, P, or a combination of N and P channel metal-oxide-semiconductor field-effect transistors (MOSFETs) (e.g., lateral double diffused MOSFETs), high electron mobility transistors (HEMTs), or other transistors and can be either enhancement mode or depletion mode provided that the controller IC 102 is compatible. The power stage IC 104 can be fabricated according to any suitable process including BiCMOS and BCD, and can be stripped down to reduce the number of layers or can use a dedicated process.

As a lateral structure device, the power stage IC 104 can have an active side 116 and a backside 118. As mentioned above, the active side 116 can include the signal connections (e.g., drain(s), source(s), gate(s)) for the high side and/or low side devices of the power stage IC 104. In some examples, a connection to the substrate of the power stage IC 104 can also occur through the active side 116. As explained below, in some examples connection to the substrate can occur through the backside 118 of the power stage IC 104 in addition to or instead of connection through the active side 116.

The power stage IC 104 can be configured to be flip-chip mounted to a suitable carrier 110. The carrier 110 can have a die connection side for connection of a die (e.g., the power stage IC 104) and an external connection side for connection to, for example, a printed circuit board (PCB). An interconnect such as chip scale package solder bumps, copper pillars, or other mechanism can electrically and/or thermally couple the active side 116 the power stage IC 104 to the carrier 110 as well as physically mount the power stage IC 104 on the carrier 110.

The controller IC 102 can comprise a die (i.e., a monolithic IC) having components for controlling the operation of the power stage. In an example, the controller IC 102 can also have a lateral structure including an active side 120 that includes the signal connections to the components and a backside 122 that is reverse of the active side 120. In an example, connection to the substrate can occur through the backside 122 of the controller IC 102. In some examples, connection to the substrate of the controller IC 102 can occur through the active side 120 in addition to or instead of connection through the backside 122.

The controller IC 102 can be composed of any suitable material with a suitable doping and can be compatible with the power stage IC 104. For example, the controller IC 102 can have a substrate formed of silicon, germanium, group III-V or III-N compounds (e.g., gallium nitride, gallium arsenide), silicon on insulator (SOI) (e.g., silicon on diamond, silicon on diamond on silicon), and others. The substrate can also be doped appropriately to form, for example, a P− or Pepi on P+ substrate. In SOI examples, the power stage IC 104 can be an N or P type backside wafer. The controller IC 102 can be fabricated according to any suitable process including BiCMOS, BCD, and CMOS technologies.

As shown in FIG. 1, the controller IC 102 can be stacked on and mounted to the power stage IC 104. The controller IC 102 can be disposed such that the backside 122 of the controller IC 102 is facing (e.g., oriented towards) and mounted on the backside 118 of the power stage IC 104. That is, the backside 122 of the controller IC 102 can be connected with a suitable die attach compound 108 to the backside 118 of the power stage IC 104. Accordingly, the power stage IC 104 can be inverted with respect to the controller IC 102. The controller IC 102 can be mounted to the power stage IC 104 using any suitable die attach compound 108 including conductive and non-conductive epoxy and solder. Specific die attach examples are explained in more detail below.

The controller IC 102 can be electrically coupled to the carrier 110 with bond wires 106. One end of a bond wire can connect to the active side 120 of the controller IC 102 and the opposite end of the bond wire can connect to a corresponding connection (e.g., pin) on the carrier 110. The bond wires 106 can be composed of gold, copper, aluminum, a combination thereof, or other suitable combinations. In other examples, the controller IC 102 can be electrically coupled to the carrier 110 with other means including, but not limited to, copper clips and aluminum ribbons.

In the example shown in FIG. 1, the stacked controller IC 102 on an inverted power stage IC 104 is in a package. As a packaged IC, the carrier 110 for the stacked controller IC 102 and power stage IC 104 can comprise a lead frame structure having a plurality of pins. The power stage IC 104 can be connected to the pins using solder 114. In an example, the plurality of pins can include a high side gate pin (e.g., for coupling to a gate of a high side transistor), a voltage in pin, Vin (e.g., for coupling to a drain of the high side transistor), a first output, Vsw, (e.g., for coupling to a source of the high side transistor), a DC ground (e.g., for coupling to the substrate and/or to a source of a low side transistor), a second output, Vsw, (e.g., for coupling to a drain of the low side transistor), a low side gate pin (e.g., for coupling to a gate of the low side transistor), and a plurality of controller IC pins for coupling to various interconnects of the controller IC 102. In some examples, connection to the substrate of the power stage IC 104 can occur by connection of an exposed portion of the substrate on the active side 116 to a pin on the carrier 110. In examples where the substrate is to be DC grounded, the pin can be coupled to DC ground. The substrate, however, can be coupled to any suitable connection including a DC voltage, a filter network (e.g., for an AC ground), or an AC voltage. In other examples, the substrate can be floating (e.g., not connected). In some examples, connection to the substrate can occur through the backside 118 of the power stage IC 104. More detail regarding backside connection to the substrate through the backside 118 is provided with respect to FIGS. 5 and 6.

Figure 12:
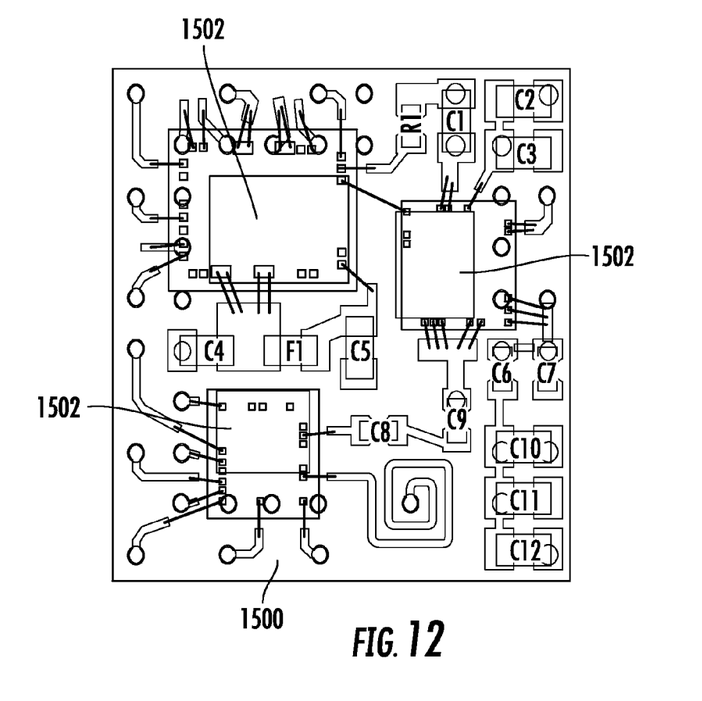
FIG. 12 is a top view of an embodiment of a printed circuit board including a plurality of controller ICs stacked on inverted power stages.

In other examples, the carrier 110 can include a PCB such that the stacked controller IC 102 on a power stage IC 104 are mounted directly on a PCB as described in more detail with respect to FIG. 12. The package for the power conversion system 100 can be composed of any suitable molding compound 112 including ceramic, plastic, or epoxy.

Figure 2:
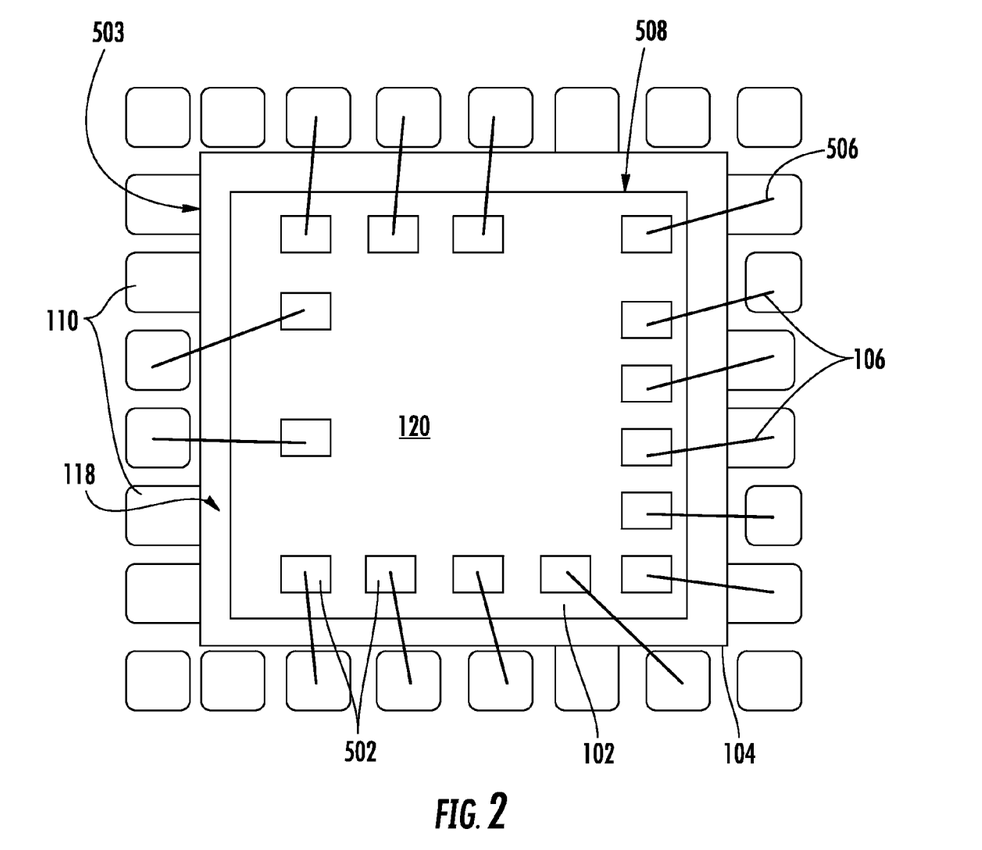
FIG. 2 is a top view of an embodiment of the power conversion system of FIG. 1.

FIG. 2 is a top view of the controller IC 102 stacked on the power stage IC 104 which is mounted on the pins of the carrier 110. As shown, some of the pins or portions thereof on the carrier 110 are disposed laterally outward from an edge 503 (e.g., footprint) of the power stage IC 104. As shown, a plurality of bond wires 106 can couple a plurality of pads 502 on the active side 120 of the controller IC 102 to these pins or portions thereof. In this example, there are pins or portions thereof disposed laterally outward from the footprint 503 of the power stage IC 104 on all four sides.

Some of these pins can be used as input/output pins for the controller IC 102 to send/receive signals from components external to the power conversion system 100. Additionally, one or more of these pins can be disposed partially outward from the edge 503 of the power stage IC 104 and partially underneath (e.g., opposite the active side 120 of) the power stage IC 104. These one or more pins can be used to couple the controller IC 102 to the power stage IC 104 by connecting the portion of the respective pin underneath the power stage IC 104 to the power stage IC 104 (e.g., to a gate) and connecting the portion of the pin outward from the edge 503 of the power stage IC 104 to a bond wire from the controller IC 102. Bond wire 506 is an example of a bond wire used to couple the controller IC 102 to the power stage IC 104.

As shown in FIG. 2, the footprint 508 of the controller IC 102 can be smaller than the footprint 503 of the power stage IC 104. This can enable portions of the backside 118 of the power stage IC 104 to be exposed and accessed. The footprint 503 of the power stage IC 104 can be larger than the footprint 508 controller IC 102 on one, two, three, or all four sides as shown in FIG. 2. In other examples, the footprint 508 of the controller IC 102 can be larger than the footprint 503 of the power stage IC 104 on one, two, three, or all four sides.

Figure 3:
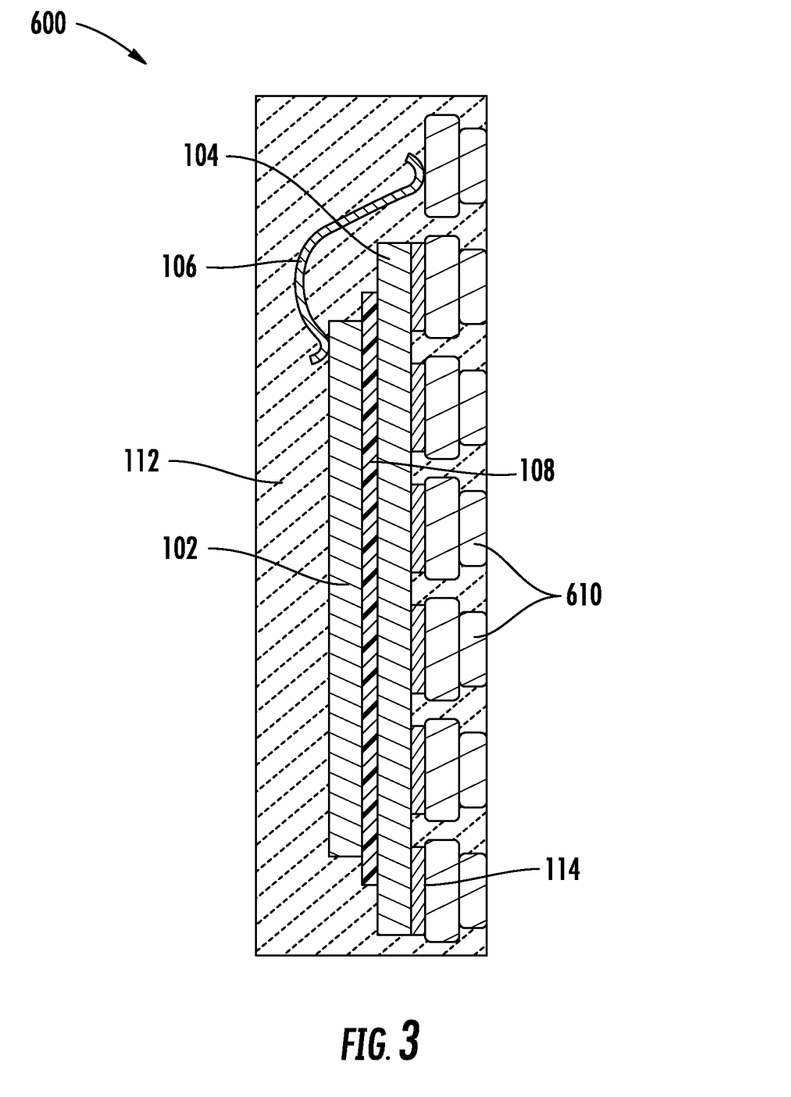
FIG. 3 is a cross-sectional view of another embodiment of a power conversion system having a controller IC stacked on an inverted power stage, wherein the power conversion system has fewer controller pins than the embodiment shown in FIG. 1.

FIG. 3 is another example of a power conversion system 600 including a stacked controller IC 102 on an inverted power stage IC 104, wherein the carrier 610 includes fewer input/output pins for the controller IC 102. As shown, on one side of the power stage IC 104, the outer edge of the pins on the carrier 610 align with the footprint of the power stage IC 104. This example can be used when fewer input/output pins are needed for the controller IC 102 and/or when a smaller package is desired.

Figure 4:
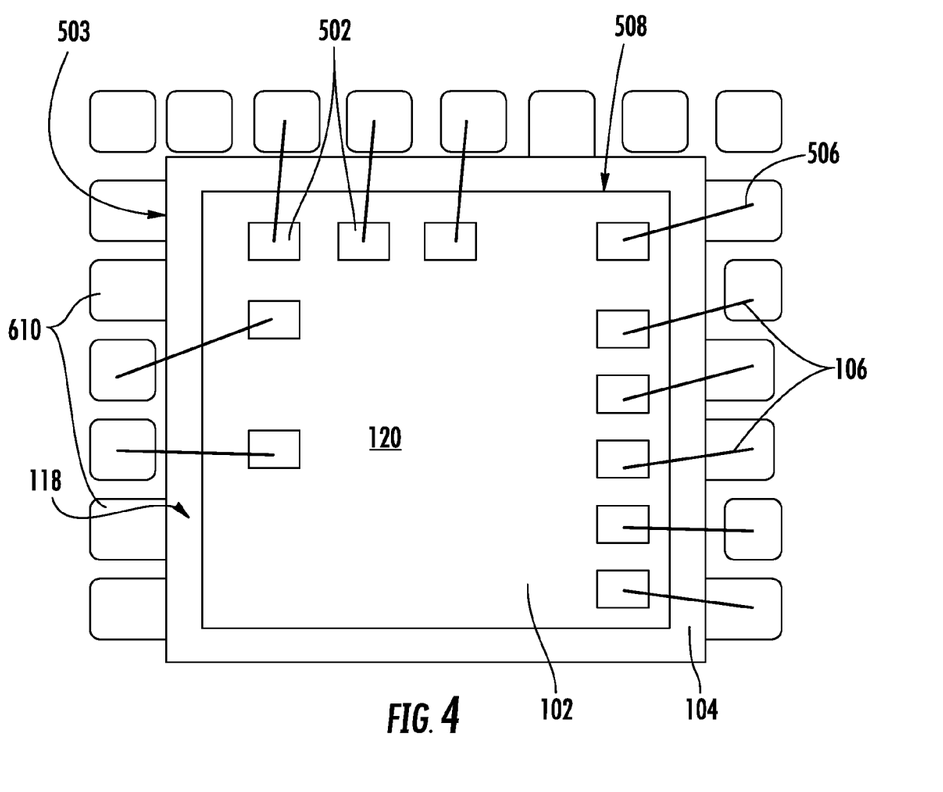
FIG. 4 is a top view of an embodiment of the power conversion system of FIG. 3.

FIG. 4 is a top view of the controller IC 102 and the power stage IC 104 of FIG. 3. As shown, some of the pins or portions thereof on the carrier 110 are disposed laterally outward from an edge 503 (e.g., footprint) of the power stage IC 104. In this example, however, there are pins or portions thereof disposed laterally outward from the footprint 503 of the power stage IC 104 on three of four sides. Accordingly, on one side of the power stage IC 104, the pins on the carrier 110 do not extend past the edge 503 of the power stage IC 104 and are aligned with the power stage IC 104. As shown, a plurality of bond wires 106 can couple a plurality of pads 502 on the active side 120 of the controller IC 102 to these pins or portions thereof.

Similar to that described with respect to FIG. 2, some of these pins can be used as input/output pins for the controller IC 102 to send/receive signals from components external to the power conversion system 100. Additionally, one or more of these pins can be disposed partially outward from the edge 503 of the power stage IC 104 and partially underneath (e.g., opposite the active side 120 of) the power stage IC 104. These one or more pins can be used to couple the controller IC 102 to the power stage IC 104 by connecting the portion of the respective pin underneath the power stage IC 104 to the power stage IC 104 (e.g., to a gate) and connecting the portion of the pin outward from the edge 503 of the power stage IC 104 to a bond wire from the controller IC 102. Bond wire 506 is an example of a bond wire used to couple the controller IC 102 to the power stage IC 104.

In some examples, the footprint 508 of the controller IC 102 can be smaller than the footprint 503 of the power stage IC 104 as shown in FIG. 2. This can enable portions of the backside 118 of the power stage IC 104 to be exposed and accessed. More detail regarding use of the backside 118 of the power stage IC 104 is provided with respect to FIGS. 5-9.

Figure 5:
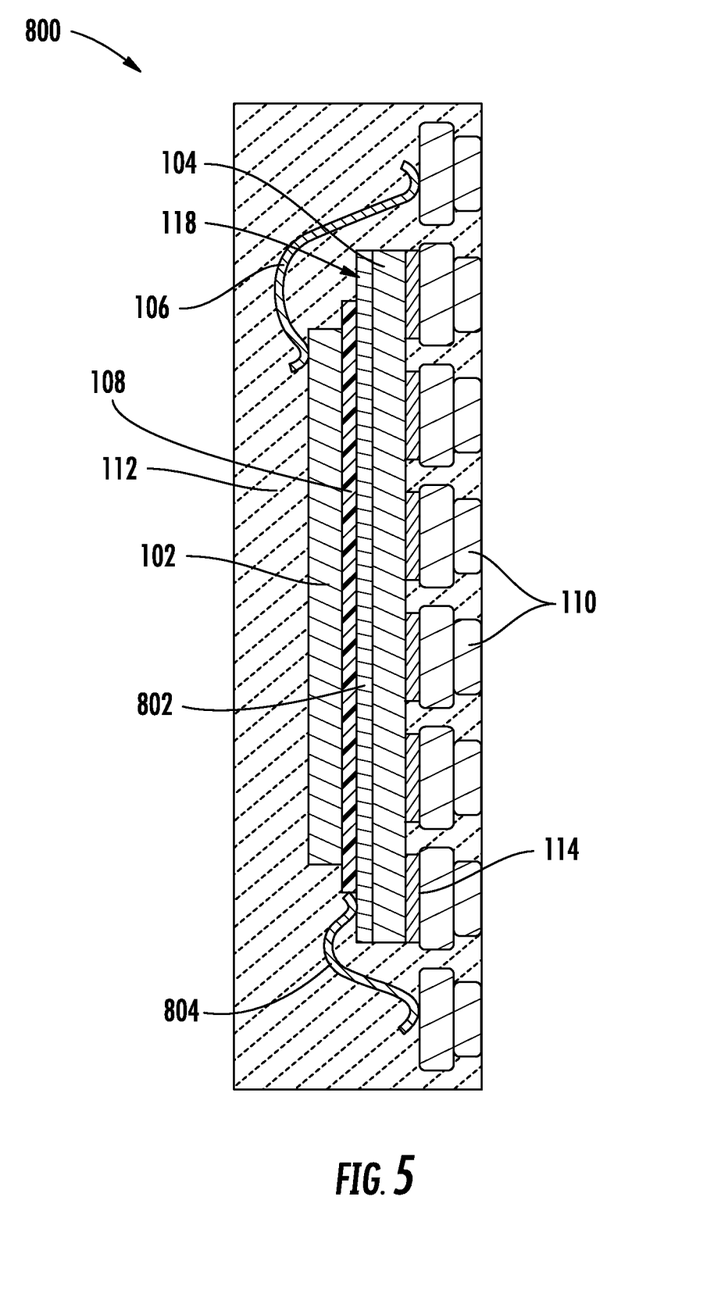
FIG. 5 is a cross-sectional view of yet another embodiment of a power conversion system having a controller IC stacked on an inverted power stage, wherein the power stage includes a metal layer on a backside thereof.

FIG. 5 is yet another example of a power conversion system 800 including a stacked controller IC 102 on an inverted power stage IC 104, wherein a metal layer 802 (also referred to as "back metal") is disposed on the backside 118 of the power stage IC 104. The metal layer 802 can provide reduced noise coupling from the power stage IC 104 to the controller IC 102. In addition, the metal layer 802 can be coupled through a wire bond 804 to a pin on the carrier 110. This wire bond 804 can provide connection to the substrate of the power stage IC 104 through the backside 118 thereof. In examples where the substrate is to be DC grounded, the pin can be coupled to DC ground. In other examples, however, the pin can be coupled to any suitable connection including a DC voltage, a filter network, or an AC voltage. In other examples, the substrate can be floating (e.g., no wire bond 804).

A die attach compound 108 can be placed between the metal layer 802 and the controller IC 102. Here, an electrically conductive epoxy or solder can be used as the die attach 108 in order to electrically couple the backside 122 of the controller IC 102 to the backside 118 of the power stage IC 104 and the bond wire 804. Additionally, in some examples, the controller IC 102 can also have a metal layer on its backside 122. Thus, the conductive epoxy or solder can electrically couple the metal layer on the backside 122 of the controller IC 102 to the backside 118 of the power stage IC 104 and the wire bond 804. Thus, connection to the substrate of the controller IC 102 can also occur through the backside 122 thereof. In examples where the substrate is to be DC grounded, a pin coupled thereto can be coupled to DC ground. The substrate, however, can be coupled to any suitable connection including a DC voltage, a filter network, or an AC voltage. In other examples, the substrate can be floating (e.g., electrically insulated from the backside 118 of the power stage IC 104 and/or not connected to wire bond 804).

The metal layer on the backside of the power stage IC 104 and/or controller IC 102 can be composed of any suitable material including: TiNiAg, TiNiAu, CrAu, TiAl, TI(AlCu) alloy (0.5% copper in Aluminum for example), TiCuAl (separate layers of Ti, Copper, Aluminum, where the Ti is thin for adhesion and low contact resistance, around 100 Angstroms to 3 Kilo-Angstroms, Cu can be thin or thick to reduce resistance around 1 Kilo-Angstrom to 3 micrometers, and the Al is used to avoid oxidation of the Copper and can be thin (200 Angstroms to 1 micron for example)). In examples wherein the power stage IC 104 and/or controller IC 102 include this metal layer, the substrate for the power stage IC 104 and/or controller IC 102 can be a Pepi with P+ substrate or a P− substrate.

Figure 6:
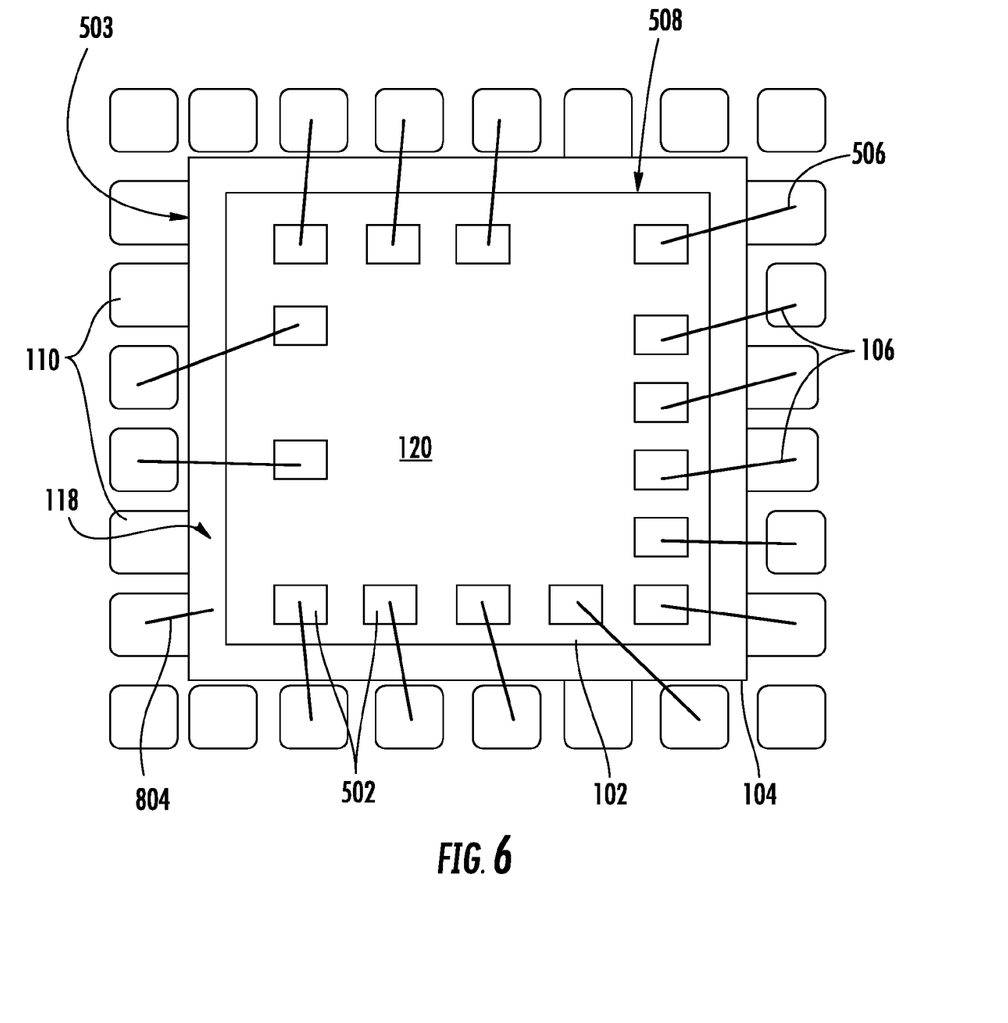
FIG. 6 is top view of an embodiment of the power conversion system of FIG. 5.

FIG. 6 is a top view of power conversion system 800 showing the controller IC 102 stacked on the power stage IC 104 which is mounted on the pins of the carrier 110. As shown, the bond wire 804 is connected to an exposed area of the backside 118 (e.g., the metal layer 802) of the power stage IC 104. This bond wire 804 is coupled on the other end to a pin (e.g., a ground pin) on the carrier 110 that is disposed laterally outward from the footprint 503 of the power stage IC 104.

Figure 7:
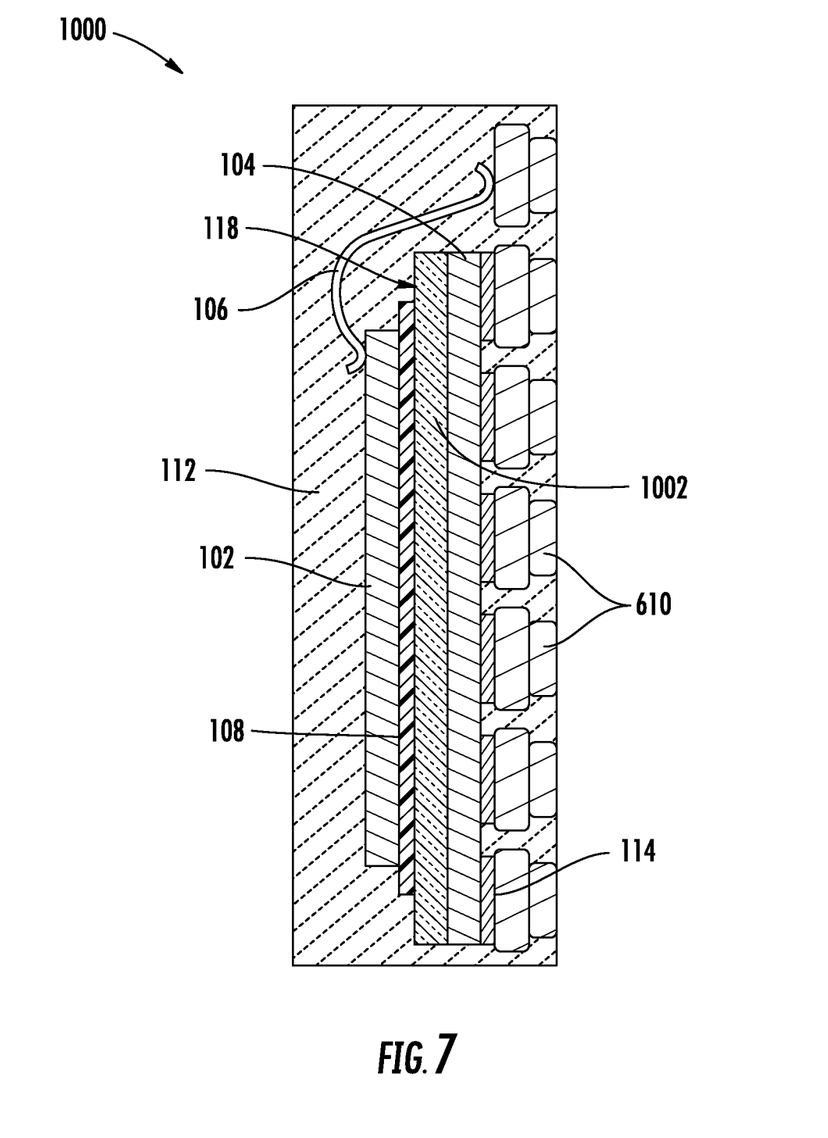
FIG. 7 is a cross-sectional view of still another embodiment of a power conversion system having a controller IC stacked on an inverted power stage, wherein the power stage includes diamond on a backside thereof.

FIG. 7 is another example of a power conversion system 1000 including a stacked controller IC 102 on an inverted power stage IC 104, wherein the power stage IC 104 includes diamond 1002 on the backside 118. Diamond 1002 can be used on the backside 118 of the power stage IC 104 in order to improve heat flow across the power stage IC 104. That is, the diamond 1002 can provide efficient lateral movement of heat from hot spots on the power stage IC 104 to locations in which the heat can be dissipated. This heat transfer can include transfer of heat to cooler locations on the power stage IC 104 and/or transfer to a thermal plug that can allow the heat to dissipate out of the package. More detail regarding a thermal plug is provided with respect to FIG. 8.

The diamond 1002 can be formed in any suitable manner. For example, power stage IC 104 can have a silicon on diamond substrate or a silicon on diamond on silicon substrate. In other examples, the power stage IC 104 can be composed of standard substrates (e.g., silicon) and another substrate having diamond therein can be bonded to the backside of the substrate. Moreover, the diamond 1002 can be micro or nano crystalline in nature. In some examples, the diamond 1002 can be doped P-type (e.g., Boron) on a P silicon substrate to promote grounding of the substrate of the power stage IC 104. In addition to spreading heat from the power stage IC 104, the diamond 104 can also aid in spreading heat from the backside 122 of the controller IC 102. Thus, the thermal gradients can even out across both the controller IC 102 and the power stage IC 104. Additionally, the diamond can improve thermal coupling between the controller IC 102 and the power stage IC 104 which can make it easier to protect the power conversion system 1000 from over heating. In an example, the die attach 108 can be a thermally conductive material (e.g., epoxy, solder) and can be disposed between the diamond 1002 on the backside 118 of the power stage IC 104 and the backside 122 of the controller IC 102. In other examples, materials other than diamond 1002 can be used as a heat spreader for the backside 118 of the power stage IC 104.

Figure 8:
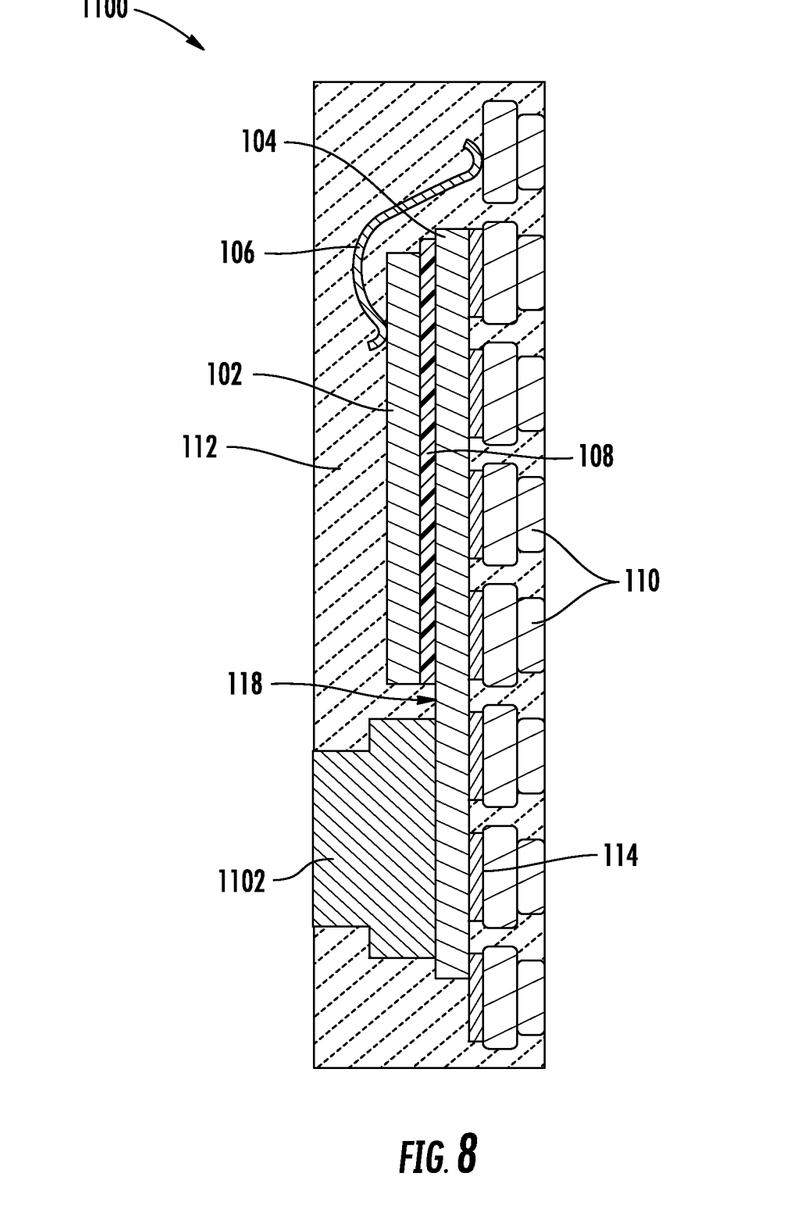
FIG. 8 is a cross-sectional view of another embodiment of a power conversion system having a controller IC stacked on an inverted power stage, wherein the power conversion system includes a thermal plug.

FIG. 8 is another example of a power conversion system 1100 including a stacked controller IC 102 on an inverted power stage IC 104, wherein a thermal plug 1102 is connected to a backside 118 of the power stage IC 104. The thermal plug 1102 can aid in dissipating heat from the power stage IC 104 by enabling the heat to be dissipated through a top of the power conversion system 1102. The thermal plug 1102 can be connected to an exposed area of the backside 118 of the power stage IC 104 and can extend through the package to be exposed on the external portion of the top of the power conversion system 1100. In other examples, other types of thermal plugs can be used that can, for example, be connected to a side of the power stage IC 104.

Figure 9:
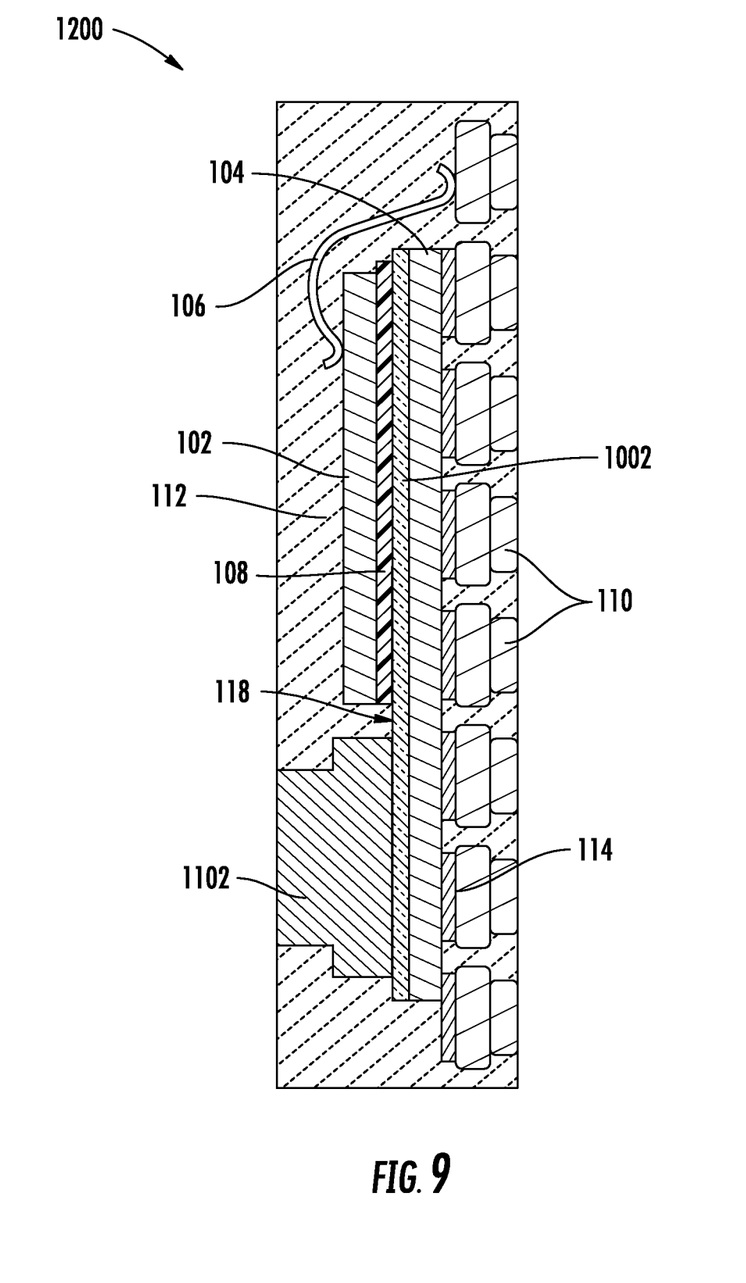
FIG. 9 is a cross-sectional view of yet another embodiment of a power conversion system having a controller IC stacked on an inverted power stage, wherein the power conversion system includes a thermal plug and diamond on a backside of the power stage.

FIG. 9 is yet another example of a power conversion system 1200 including a stacked controller IC 102 on an inverted power stage IC 104 with both a thermal plug 1102 and diamond 1002 on the backside 118 of the power stage IC 104. Here, the thermal plug 1102 can have the same function as described with respect to FIG. 8 and the diamond 1002 can be used to further increase the heat dissipation of the thermal plug 1102 by providing more efficient heat transfer across the power stage IC 104 and the controller IC 102 to the thermal plug 1102.

Figure 10:
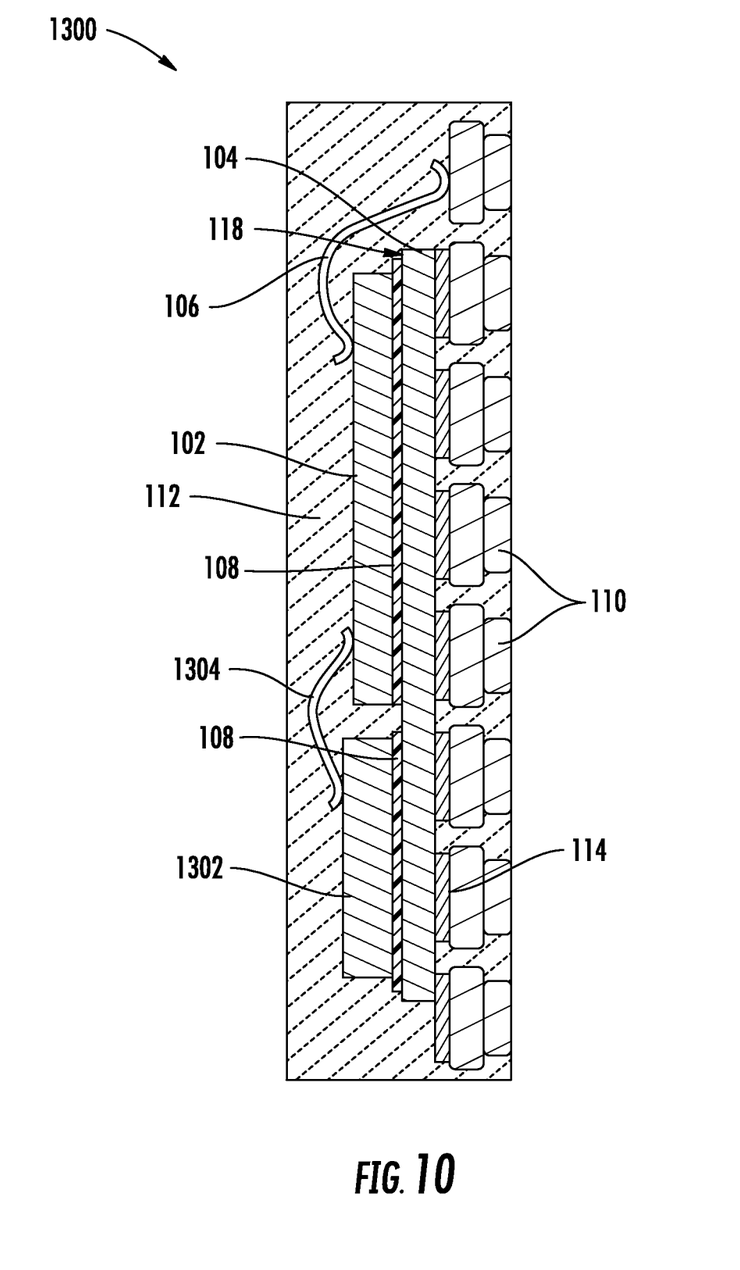
FIG. 10 is a cross-sectional view of still another embodiment of a power conversion system having multiple ICs stacked on an inverted power stage IC.

FIG. 10 is still another example of a power conversion system 1300 including multiple ICs 102, 1302 stacked on an inverted power stage IC 104. In this example, the multiple ICs 102, 1302 include a controller IC 102 and a driver IC 1302. Similar to the controller IC 102 discussed above, driver IC 1302 can comprise a die (i.e., a monolithic IC) having components for driving the high side and/or low side device in the power stage IC 104. In an example, the driver IC 1302 can have a lateral structure including an active side that includes the signal connections to the components and a backside that, in some examples, can be used as a connection to the substrate (e.g., a DC ground). In other examples, more than two monolithic ICs (i.e., dies) can be stacked on the power stage IC 104.

The multiple ICs 102, 1302 can be stacked as described with respect to FIG. 1. For example, the multiple ICs 102, 1302 can be mounted to the power stage IC 104 using any suitable die attach compound 108 including conductive and non-conductive epoxy and solder. In some examples one or more of the ICs 102, 1302 stacked on the power stage IC 104 can be disposed such that a backside of the one or more ICs 102, 1302 is mounted on the backside 118 of the power stage IC 104. That is, the backside of one or more of the ICs 102, 1302 can be connected with a suitable die attach compound 108 to the backside 118 of the power stage IC.

The multiple ICs 102, 1302 can be electrically coupled to the carrier 110 with bond wires 106. One end of a bond wire can connect to the active side of the multiple ICs 102, 1302 and the opposite end of the bond wire can connect to a pin on the carrier 110. The multiple ICs 102, 1302 can also be electrically coupled together via one or more die to die bond wires 1304.

In some examples, the power conversion system 1300 can have the backside 118 of the power stage IC 104 coupled to the carrier 110 as discussed with respect to FIG. 5. Additionally, in some examples the power conversion system 1300 can include diamond on the backside 118 of the power stage IC 104. Finally, some examples of the power conversion system 1300 can include a thermal plug on the backside 118 of the power stage IC 104.

Figure 11:
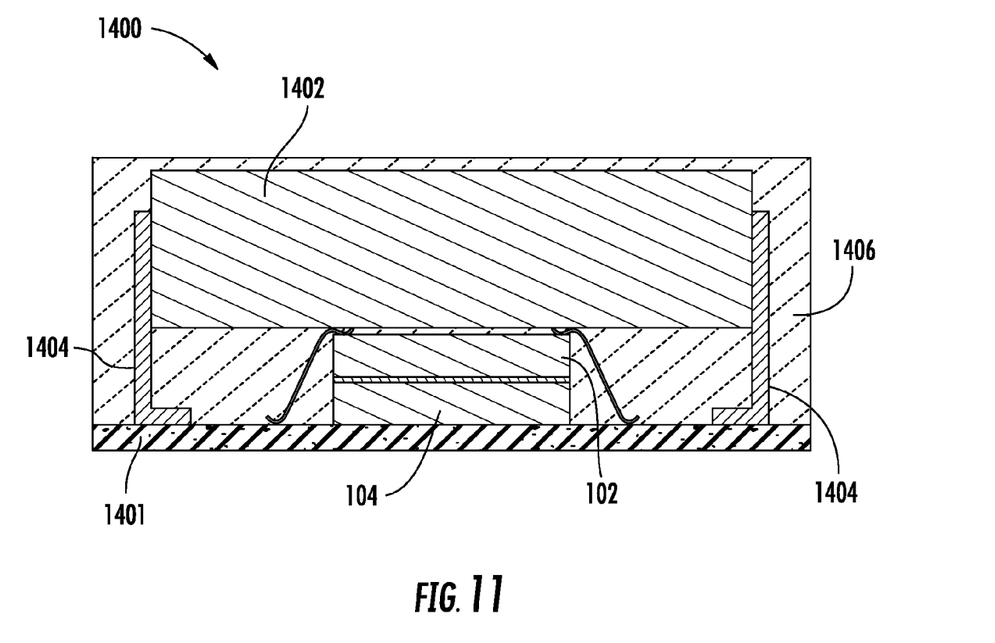
FIG. 11 is a cross-sectional view of another embodiment of a power conversion system having a controller IC stacked on an inverted power stage IC along with a bridged inductor mounted thereon

FIG. 11 is a cross-sectional view of another example of a power conversion system 1400 having a controller IC 102 stacked on an inverted power stage IC 104 along with a bridged inductor 1402 mounted thereon. The power stage IC 104 can be flip-chip mounted onto a carrier 1401, and the controller IC 102 can be stacked and mounted on the power stage IC 104 as described with respect to FIG. 1. The stacked controller IC 102 and power stage 104 can be disposed underneath an inductor 1402 that is electrically coupled and connected to the carrier 1401 with copper supports 1404. The inductor 1402, power stage IC 104, and controller IC 102 can be surrounded by a suitable molding compound 1406.

FIG. 12 is a top view of an embodiment of a printed circuit board (PCB) 1500 including a plurality of stacked controller ICs on inverter power stage ICs. As shown, controller IC 102 stacked on a power stage IC 104 can also be mounted on a PCB 1500. Here, the power stage IC 104 can be mounted on the PCB 1500 and the controller IC 102 can be stacked and mounted on the power stage IC 104 as described with respect to FIG. 1. In an example, a HLA construction can be used. As shown, multiple stacked controller IC and power stage IC combinations 1502 can be included on the PCB 1500. Use of this on a PCB 1500 can enable die to die wire bonding from, for example, a controller IC 102 on a first power stage IC 104 to a different (second) power stage IC 104. Stacking the controller IC 102 can also enable reduced length wire bonds for coupling to the controller IC 102. In addition, the PCB 1500 can include an etched inductor as well as other components including discrete components.

A stacked controller IC 102 on a power stage IC 104 can be used in many circuit configurations including a DC-to-DC power converter, a charger, a hot-swap controller, an AC-DC converter, a bridge driver, a buck converter, a boost converter, a buck-boost converter, a synchronous buck converter, or other suitable circuit.

In some examples, a controller IC 102 stacked on a power stage IC 104 can provide a high power density for a power conversion system. Power density can correspond to a current and voltage rating of the power conversion system in relation to a footprint of the power conversion system, wherein a higher current and voltage rating with respect to a footprint corresponds to a higher power density. Additionally, some examples, a stacked controller IC 102 on a power stage 104 can provide for high efficiency in power conversion systems, where efficiency is related to the series resistance (Rdson) of a power stage for the power conversion system, and a lower series resistance corresponds to a higher efficiency. Moreover, in some examples, a stacked controller IC 102 on a power stage 104 can provide for a low cost power conversion system, where cost is based on RdsON times area for the system, and wherein a lower Rdson times area corresponds to a lower cost fabrication technique (e.g., number of masking layers), and packaging assembly technique (e.g., number of steps, and bill-of-material).

Although described as separate Figures herein, suitable components from different Figures can be integrated together into a single power conversion system. For example, a power conversion system can include a controller IC stacked on a power stage IC with a thermal plug on the backside (as shown in FIG. 8) and a ground or other connection to the backside of (as shown in FIG. 5). Other combinations can also be made.

A power conversion system such as system 100, 600, 800, 1000, 1100, 1200, and 1300 having a controller IC 102 stacked on an inverted power stage IC 104 can be manufactured into a packaged IC as shown in the corresponding Figures. Example steps for manufacturing the power conversion system into a packaged IC are provided below.

Manufacturing the power conversion system into a packaged IC can include manufacturing a plurality of the packaged ICs at the same time. Accordingly, a plurality of lead frames can be provided adjacent to one another, each having a power conversion system assembled thereon. Once assembled, the lead frames and associated components can be singulated to form the individual packaged ICs. The following description refers to the process of forming a single packaged IC, but it should be understood that the process can involve forming a plurality of packaged ICs at the same time.

The power stage IC 104, controller IC 102, and the lead frame are all obtained for manufacture of the packaged IC. The power stage IC 104 can be fabricated as a die (e.g., monolithic IC) having a lateral structure using semiconductor processes. Similarly, the controller IC 102 can be fabricated as a die (e.g., monolithic IC) having a lateral structure using semiconductor processes. In examples where the power stage IC 104 includes a backside layer such as a metal layer 802 (shown in FIG. 5) or a diamond layer 1002 (shown in FIG. 9), the backside layer can be added during fabrication. For example, a metal layer 802 can be deposited on the backside of a wafer of a plurality of power stage ICs 104 prior to singulation. For a diamond layer 1002, a substrate having a diamond layer can be mounted to the backside of a wafer of a plurality of power stage ICs 104 prior to singulation. The diamond layer 1002 can also be formed by deposition on the backside of a wafer of a plurality of power stage ICs 104 prior to singulation.

The power stage IC 104 can be mounted to the lead frame such that the active side 116 is attached and electrically coupled to pads on the lead frame. In an example, the lead frame can be coated with solder 114 using a solder mask and solder paint. In another example, a plurality of solder balls can be placed on the active side 116 of a wafer of a plurality of power stage ICs 104 prior to singulation of the wafer (e.g., using chip scale packaging (CSP) techniques). In any case, the power stage IC 104 can be aligned with and placed on the lead frame. In some examples, the solder 114 can be reflowed once the power stage IC 104 is in position on the lead frame.

The controller IC 102 can be mounted to the backside 118 of the power stage IC 104 such that the backside 122 of the controller IC 102 is facing and attached to the backside 118 of the power stage IC 104. To accomplish this, the backside 118 of the power stage IC 104, the backside 122 of the controller IC 102, or both can be coated with an appropriate die attach compound 108 such as solder or epoxy. In an example, the die attach compound 108 can be coated on the backside 122 of a wafer of a plurality of controller ICs 102 prior to singulation. In addition to, or instead of, the backside 122 of the controller IC 102, die attach compound 108 can be coated on the backside 118 of a wafer of a plurality of power stage ICs 104 prior to singulation. In other examples, the die attach compound 108 can be placed on the backside 122 of the controller IC 102 and/or the backside 118 of the power stage IC 104 after singulation. With the die attach compound 108 thereon, controller IC 102 can be placed on the backside 118 of the power stage IC 104. The controller IC 102 can be secured to the backside 118 of the power stage IC 104 by reflowing the solder or curing the epoxy.

In examples including a thermal plug 1102 (e.g., as shown in FIGS. 8 and 9), the thermal plug 1102 can be positioned on the backside 118 of the power stage IC 104 adjacent to the controller IC 102 and adhered to the backside 118 using an appropriate adhesive. In examples including one or more dies in addition to the controller IC 102 that are mounted on the power stage IC 104, the additional one or more dies can be mounted to the backside 118 of the power stage IC 104 using a suitable die attach compound 108. For example, a driver IC 1302 can be fabricated as a die (e.g., monolithic IC) having a lateral structure using semiconductor processes. The driver IC 1302 can be mounted to the power stage IC 104 such that a backside of the driver IC 1302 is attached to the backside 118 of the power stage IC 104. The driver IC 1302 can be mounted in a similar manner to that described with respect to the controller IC 102.

In an example, the solder used to attach any dies (e.g., the controller IC 102, driver IC 1302) to the power stage IC 104 can have a different melting temperature than the solder 114 used to connect the power stage IC 104 to the lead frame. In other examples, the solders can have a similar melting temperature.

Once mounted, the controller IC 102 can be electrically coupled to the lead frame. In an example, the controller IC 102 can be electrically coupled by wire bonding from the active side 120 to appropriate pads on the lead frame. In other examples, copper clips or aluminum ribbons can be coupled to the active side 120 and the lead frame. In examples where the backside 118 of the power stage IC 104 is electrically coupled to the lead frame (e.g., a ground pin), wire bonding can include coupling one or more wire bonds to the backside 118 of the power stage IC 104 and to appropriate pad(s) on the lead frame. Wire bonding for the controller IC 102 and the power stage IC 104 can occur in one or more than one pass. In examples including one or more addition dies mounted to the backside 118 of the power stage IC 104 (e.g., as shown in FIG. 10), an active side of the one or more additional dies can be electrically coupled (e.g., using wire bond(s), copper clip(s), or aluminum ribbon(s)) to the active side 120 of the controller IC 102 and/or to one or more appropriate pads on the lead frame.

Once the controller IC 102 and the power stage IC 104 have been electrically coupled to the lead frame, molding compound 112 can be applied over the controller IC 102, power stage IC 104, and the lead frame. In a process forming a plurality of packaged ICs at the same time, molding compound 112 can be applied over the plurality of assembled power conversion system structures. Once applied, the molding compound 112 can be cured. In some examples, the top of the cured molding compound 112 can be ground, for example, to expose the thermal plug 1102 at an exterior of the package. When forming a plurality of packaged ICs at the same time, the structure after application and curing of the molding compound 112 can be singulated to form a plurality of individual packaged ICs having a controller IC 102 stacked on an inverted power stage IC 104.

A power conversion system such as system 100, 600, 800, 1000, 1100, 1200, 1300, 1400 and the systems shown in FIG. 12 having a controller IC 102 stacked on an inverted power stage IC 104 can provide regulated power to various loads. The power conversion system can receive unregulated power (e.g., line power), regulate the unregulated power, and provide regulated power to the load(s). As should be understood, the power conversion system can operated in conjunction with other components and devices to provide the regulated power.

Figure 13:
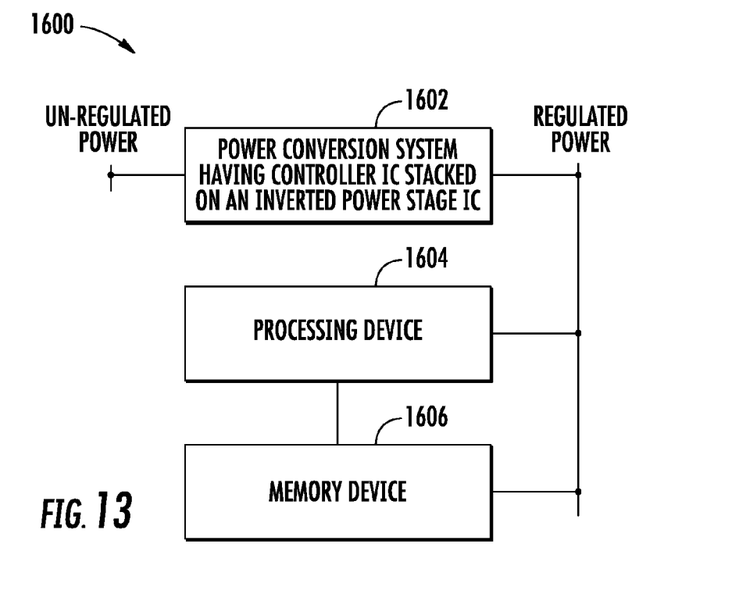
FIG. 13 is a block diagram of an embodiment of a system including a power conversion system having a controller IC stacked on an inverted power stage providing regulated power to a processing device and a memory device.

FIG. 13 is a block diagram of an example system 1600 including such a power conversion system. System 1600 includes one or more power conversion systems 1602 coupled to one or more processing devices 1604 and one or more memory devices 1606. The one or more power conversion systems 1602 can receive unregulated power (e.g., line power), regulate the power, and provide regulated power to the one or more processing devices 1604 and one or more memory devices 1606. In an example, the one or more processing devices 1604 can include a central processing unit (CPU), microcontroller, microprocessor (e.g., a digital signal processor (DSP)), field programmable gate array (FPGA), application specific integrated circuit (ASIC), or other processing device. The one or more memory devices 1606 can include a conventional hard disk, volatile or non-volatile media such as a solid state hard drive, random access memory (RAM) including, but not limited to, synchronous dynamic random access memory (SDRAM), double data rate (DDR) RAM, RAMBUS dynamic RAM (RDRAM), static RAM (SRAM), etc.), electrically erasable programmable ROM (EEPROM), and flash memory, etc. The one or more processing devices 1604 can be communicatively coupled to the one or more memory devices 1606.

In other examples, such a power conversion system can provide regulated power to other functional circuits instead of or in addition to one or more processing devices and one or more memory devices. For example, such a power conversion system can provide power to internal device components, peripheral devices, or other components. Such a power conversion system can be included in any suitable electronic device using regulated power such as a desktop, laptop, or tablet computer, a set top box, battery charger, or other device.

A number of examples of the invention defined by the following claims have been described. Nevertheless, it will be understood that various modifications to the described examples may be made without departing from the spirit and scope of the claimed invention. Features and aspects of particular examples described herein can be combined with or replace features and aspects of other examples. Accordingly, other examples are within the scope of the following claims.

What is claimed is:

1. A method of manufacturing a packaged circuit having a first die mounted on an inverted second die, the method comprising:
    mounting the second die to a lead frame such that an active side of the second die is attached to the lead frame, wherein the second die includes a power stage with source, drain, and gate connections on the active side;
    mounting the first die to a backside of the second die such that a backside of the first die is attached to the backside of the second die, wherein the first die has a lateral structure with all signal connections on an active side of the first die, said signal connections include source, drain, and gate connections;
    electrically coupling the active side of the first die to the lead frame; and
    electrically coupling the backside of the second die to the lead frame, wherein electrically coupling the backside includes electrically coupling a substrate of the second die to the lead frame.

2. The method of claim 1, wherein the first die comprises a controller.

3. The method of claim 1, wherein mounting the second die to the lead frame includes electrically coupling the second die to the lead frame using one or more of solder balls on the second die or solder on pads of the lead frame.

4. The method of claim 1, wherein mounting the first die to the backside of the second die includes using one of solder or epoxy to attach the backside of the first die to the backside of the second die.

5. The method of claim 1, wherein electrically coupling the active side of the first die to the lead frame includes wire bonding, using one or more copper clips, or using one or more aluminum ribbons.

6. The method of claim 1, comprising:
    mounting a third die to the backside of the second die such that a backside of the third die is attached to the backside of the second die; and
    electrically coupling an active side of the third die to the active side of the first die.

7. The method of claim 1, comprising:
    depositing molding compound over the second die and the first die; and
    curing the molding compound.

8. The method of claim 7, comprising:
    attaching a thermal plug to the backside of the second die; and
    grinding the molding compound to expose the thermal plug.

9. The method of claim 1, comprising:
    electrically coupling the backside of the first die to the lead frame.

10. The method of claim 9, wherein electrically coupling the backside of the first die includes electrically coupling a substrate of the first die to the lead frame.

11. The method of claim 1, wherein the second die has a lateral structure.

* * * * *